United States Patent [19]

Baba

[11] Patent Number: 4,882,550
[45] Date of Patent: Nov. 21, 1989

[54] OSCILLATOR/AMPLIFIER CONNECTING STRUCTURE

[75] Inventor: Toshiki Baba, Odaka, Japan

[73] Assignee: Alps Electric Co., Ltd., Tokyo, Japan

[21] Appl. No.: 307,439

[22] Filed: Feb. 7, 1989

[30] Foreign Application Priority Data

Apr. 12, 1988 [JP] Japan .................................. 63-48850

[51] Int. Cl.[4] .......................... H03B 5/18; H04B 1/50; H05K 7/08
[52] U.S. Cl. ....................................... 331/49; 331/74; 331/96; 361/400; 455/84; 455/319
[58] Field of Search ....................... 331/49, 56, 74, 75, 331/96; 361/400; 455/84, 90, 319

[56] References Cited

U.S. PATENT DOCUMENTS 4,325,035 4/1982 Nisbikawa et al. .................. 331/96

Primary Examiner—Siegfried H. Grimm
Attorney, Agent, or Firm—Guy W. Shoup; Paul J. Winters; Stephen L. Malaska

[57] ABSTRACT

A connecting structure for connecting two oscillator circuits to an amplifier. The oscillator circuits are provided on one surface of a printed circuit board and include two dielectric resonators. The amplifier circuit is provided on the other surface of the printed circuit board for selectively amplifying oscillatory outputs from the oscillator circuits. The dielectric resonators are fixed to a metal plate mounted on the printed circuit board, and the amplifier circuit is located at a position opposite to the metal plate.

1 Claim, 2 Drawing Sheets

OSCILLATOR/AMPLIFIER CONNECTING STRUCTURE

BACKGROUND OF THE INVENTION

The present invention relates to a connecting structure for an oscillator for use with a simplex type mobile radio communication equipment, for example.

In the simplex type radio communication equipment, transmitting and receiving are not carried out simultaneously, but they are selected to be independently operated. FIG. 3 shows a circuit diagram of the simplex type radio communication equipment. In transmitting, a carrier formed by a carrier oscillator 22 is modulated by a sound signal from a microphone 21, and is amplified by an amplifier 23. Then, it is fed through a band pass filter 24 and an output amplifier 25 to an antenna switch 26, and is transmitted from an antenna 27. In receiving, the antenna switch 26 is selected to a receiving position, and an input signal from the antenna 27 is fed to a mixer 28. On the other hand, an output from a local oscillator 29 is fed through the amplifier 23 and a band pass filter 30 to the mixer 28. Then, it is mixed with the input signal from the antenna 27 in the mixer 28 to obtain an intermediate frequency. In this circuit, a pair of oscillators (the carrier oscillator 22 and the local oscillator 29) are both connected to the amplifier 23, and either of the output from the oscillator 22 or the output from the oscillator 29 is input to the amplifier 23.

FIGS. 4 and 5 show an exemplary connecting structure for the oscillator as mentioned above. The oscillators 22 and 29 are mounted on a substrate 31 above the upper surface of a shield plate 37 made of metal, and the amplifier 23 is mounted on a substrate 32 below the lower surface of the shield plate 37. The oscillators 22 and 29 are formed from a pair of resonators 36 each including a cylindrical dielectric 33, an inner conductor 34 and an outer conductor 35 as electrodes both attached to the cylindrical dielectric 33, and from an oscillator circuit including a pair of oscillator circuit parts 38 mounted on the substrate 31 fixed to the shield plate 37 at its one end by an adhesive or the like. Each resonator 36 is fixed to the shield plate 37 by directly soldering the outer conductor 35 to the shield plate 37. On the other hand, the amplifier 23 includes a pair of amplifier circuit parts 39 mounted on the lower surface of the substrate 32 fixed to the lower surface of the shield plate 37. The substrates 31 and 32 and the shield plate 37 are formed with a through-hole 40 for inserting a connecting rod 41 thereinto. The connecting rod 41 is soldered at its upper and lower ends to the substrates 31 and 32, thereby electrically connecting the oscillator circuit with the amplifier circuit. With this arrangement, the oscillation generated from the resonators 36 is intended not to have an influence upon the amplifier circuit.

However, the prior art structure as mentioned above is a three-layer structure constructed of the pair of substrates and the shield plate. This three-layer structure causes the following disadvantages.

(1) The number of parts is increased to cause an increase in material cost.

(2) The number of manufacturing steps is increased to cause an increase in manufacturing cost.

(3) In receipt of external mechanical vibration, each substrate and the shield plate are independently vibrated to cause a reduction in S/N ratio.

SUMMARY OF THE INVENTION

It is an object of the present invention to provide a connecting structure for an oscillator which may prevent the interference between the oscillator circuit and the amplifier circuit.

It is another object of the present invention to reduce the manufacturing cost and the material cost with a reduced number of parts and manufacturing steps in manufacturing the connecting structure for the oscillator.

It is a further object of the present invention to provide a connecting structure for an oscillator which may suppress the generation of noise due to external mechanical vibration.

According to the present invention, there is provided a connecting structure for an oscillator comprising a printed circuit board, two oscillator circuits provided on one surface of the printed circuit board and including dielectric resonators, an amplifier circuit provided on the other surface of the printed circuit board for selectively amplifying oscillatory outputs from the oscillator circuits, and a metal plate mounted on the printed circuit board, wherein the dielectric resonators are juxtaposed on the metal plate and fixed thereto, and the amplifier circuit is located at a position opposite to the metal plate.

As mentioned above, the oscillator circuits and the amplifier circuit are provided on the opposite surfaces of the printed circuit board, and the dielectric resonators are juxtaposed on the metal plate and fixed thereto. That is, the connecting structure according to the present invention is a two-layer structure constructed to the printed circuit board and the metal plate. Thus, the number of parts and the number of manufacturing steps are reduced to thereby achieve a reduced manufacturing cost. Further, owing to the two-layer structure, any portions vibrating independently in receipt of external mechanical vibration may be reduced to thereby improve the S/N ratio. Further, the interference between the amplifier circuit and the oscillator circuit may be sufficiently suppressed by suitably designing a shape of the metal plate.

Other objects and features of the invention will be more fully understood from the following detailed description and appended claims when taken with the accompanying drawings.

DETAILED DESCRIPTION OF THE PREFERRED EMBODIMENTS

Figure 1:
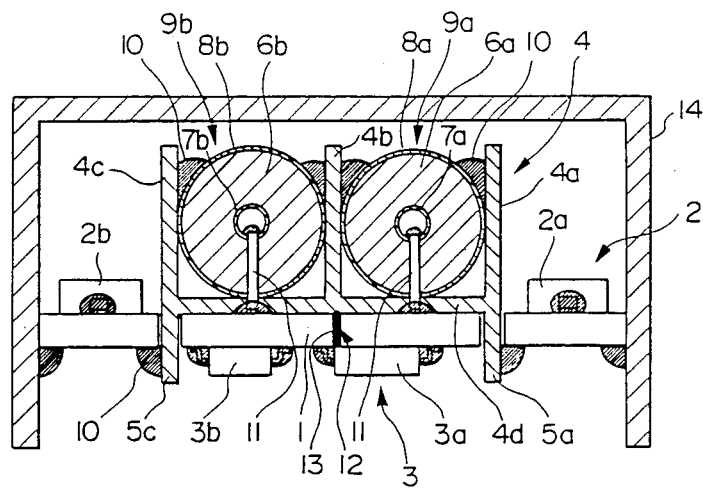
FIG. 1 is an elevational view of a preferred embodiment of the present invention.
Figure 2:
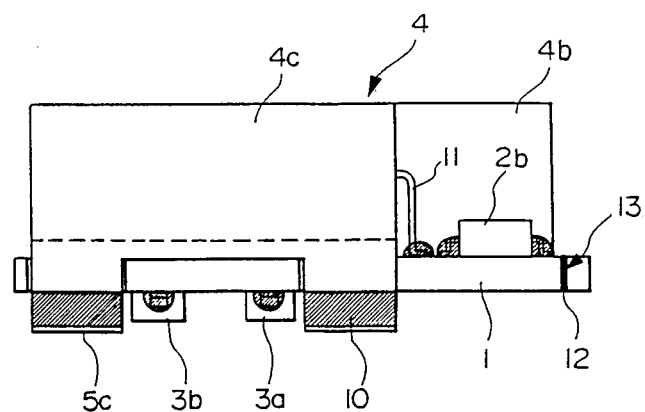
FIG. 2 is a side view of FIG. 1.
Figure 3:
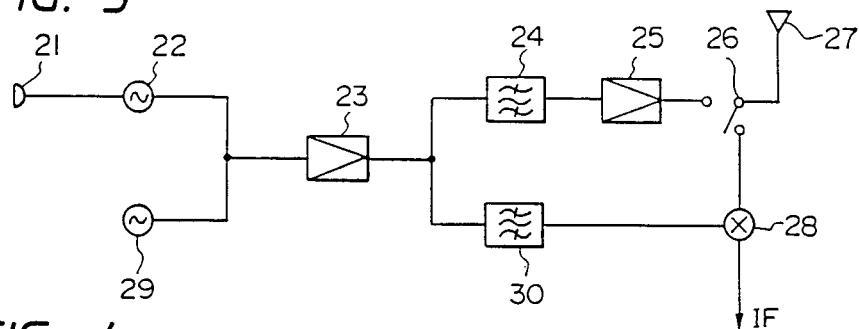
FIG. 3 is a circuit diagram of the simplex type radio communication equipment.
Figure 4:
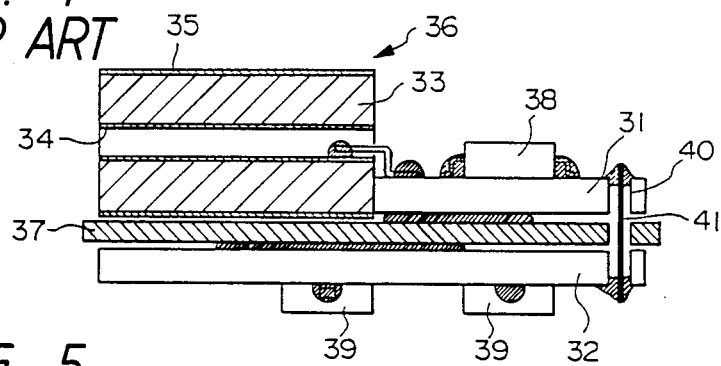
FIG. 4 is an elevational view of the prior art.
Figure 5:
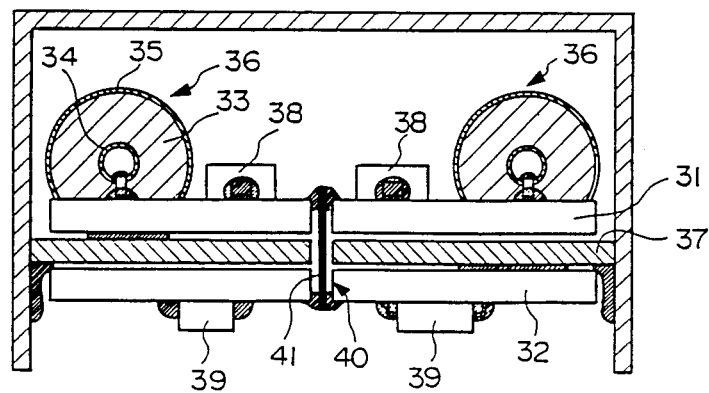
FIG. 5 is a side view of FIG. 4.

Referring now to FIGS. 1 and 2, reference numeral 1 designates a printed circuit board formed with a printed circuit by copper foil at a suitable position of opposite side surfaces thereof. An oscillator circuit 2 including oscillator circuit parts 2a and 2b is formed on the upper surface of the printed circuit board 1, and an amplifier circuit 3 including amplifier circuit parts 3a and 3b is formed on the lower surface of the printed circuit board 1.

Reference numeral 4 designates a metal plate comprised of three vertical plate members 4a, 4b and 4c and a horizontal plate member 4d connecting the vertical plate members 4a, 4b and 4c at their lower ends. The metal plate 4 is mounted on the upper surface of the printed circuit board 1, and is fixed thereto in such a manner that projections 5a and 5c of the vertical plate members 4a and 4c projecting downwardly through the printed circuit board 1 are soldered at 10 to the copper foil (ground circuit) on the lower surface of the printed circuit board 1. A pair of resonators 9a and 9b are mounted on the upper surface of the metal plate 4, and are disposed between the vertical plate members 4a and 4b and between the vertical plate members 4b and 4c, respectively. The resonators 9a and 9b are constructed of cylindrical dielectrics 6a and 6b, inner conductors 7a and 7b and outer conductors 8a and 8b as electrodes, respectively. Spaces between the outer conductor 8a and the vertical plate members 4a and 4b are filled with solder 10, and spaces between the outer conductor 8b and the vertical plate members 4b and 4c are also filled with solder 10, thereby electrically and mechanically connecting the outer conductors 8a and 8b to the metal plate 4. The inner conductors 7a and 7b of the resonators 9a and 9b are connected through crank-shaped connector wires 11 to the copper foil of the oscillator circuit 2. The amplifier circuit 3 is disposed on the opposite side of the metal plate, so that resonation of the resonators 9a and 9b may be blocked by the horizontal plate member 4d, the vertical plate members 4a, 4b and 4c (inclusive of the projections 5a and 5c) and the outer conductors 8a and 8b, and may have no influence upon the amplifier circuit 3. Electrical connection between the oscillator circuit 2 and the amplifier circuit 3 is established by a connecting rod 13 inserted into a hole 12 formed through the printed circuit board 1. Reference numeral 14 designates a shield case for covering all of these elements as mentioned above.

Such a connecting structure for the oscillator as mentioned above is formed from a two-layer structure constructed by the printed circuit board 1 and the metal plate 4. Accordingly, the following advantages can be obtained.

(1) As the printed circuit board 1 which is expensive in manufacturing cost is singly necessary, and the metal plate 4 itself is easily manufactured by bending and bonding, a material cost may be reduced.

(2) As the manufacturing of the connecting structure may be established by only bonding the printed circuit board 1 to the metal plate, the number of manufacturing steps may be reduced. Further, as the connecting rod 13 for connecting the oscillator circuit 2 with the amplifier circuit 3 is inserted into the printed circuit board 1 only, drilling for making the hole 12 for insertion of the connecting rod 13 may be simplified, and the hole 12 may be made small as compared with the prior art wherein the shield plate is drilled.

(3) In receipt of external mechanical vibration, the printed circuit board 1 and the metal plate 4 are independently vibrated. However, as the parts mounted are less as compared with the prior art, and the metal plate 4 itself has a shape such that is is hard to vibrate, the vibration of the connecting structure may be suppressed. Moreover, as the metal plate 4 is fixed at the projections 5a and 5c to the printed circuit board 1 by the solder 10, the vibration of the connecting structure may be further suppressed. Accordingly, a reduction in S/N ratio due to the vibration may be also suppressed.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A connecting structure for an oscillator comprising a printed circuit board, two oscillator circuits provided on one surface of said printed circuit board and including dielectric resonators, an amplifier circuit provided on the other surface of said printed circuit board for selectively amplifying oscillatory outputs from said oscillator circuits, and a metal plate mounted on said printed circuit board, wherein said dielectric resonators are juxtaposed on said metal plate and fixed thereto, and said amplifier circuit is located at a position opposite to said metal plate.

* * * * *